(12) United States Patent
Gurumurthy

(10) Patent No.: US 9,419,014 B2
(45) Date of Patent: Aug. 16, 2016

(54) ALTERNATING TAP-CELL STRATEGY IN A STANDARD CELL LOGIC BLOCK FOR AREA REDUCTION

(71) Applicant: Texas Instruments Incorporated, Dallas, TX (US)

(72) Inventor: Girishankar Gurumurthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 246 days.

(21) Appl. No.: 14/108,537

(22) Filed: Dec. 17, 2013

(65) Prior Publication Data

US 2014/0183602 A1    Jul. 3, 2014

Related U.S. Application Data

(60) Provisional application No. 61/746,692, filed on Dec. 28, 2012.

(51) Int. Cl.
| | |
|---|---|
| *H01L 27/118* | (2006.01) |
| *H01L 27/115* | (2006.01) |
| *H01L 27/22* | (2006.01) |
| *H01L 27/02* | (2006.01) |

(52) U.S. Cl.
CPC ...... *H01L 27/11803* (2013.01); *H01L 27/0207* (2013.01); *H01L 27/115* (2013.01); *H01L 27/11521* (2013.01); *H01L 27/11807* (2013.01); *H01L 27/224* (2013.01); *H01L 2027/11861* (2013.01)

(58) Field of Classification Search
CPC ............ H01L 27/11521; H01L 27/115; H01L 27/224
USPC .................................................. 257/202, 206
See application file for complete search history.

(56) References Cited

U.S. PATENT DOCUMENTS 5,977,574 A * 11/1999 Schmitt ............. H01L 27/11807
257/206

* cited by examiner

*Primary Examiner* — Howard Weiss
*Assistant Examiner* — Tifney Skyles
(74) *Attorney, Agent, or Firm* — John R. Pessetto; Frank D. Cimino

(57) ABSTRACT

An integrated circuit includes a plurality of N wells disposed on a P substrate. A plurality of tap columns is located across the plurality of N wells and a plurality of standard cells is located between the tap columns. A plurality of tap cells is disposed consecutively in the plurality of tap columns. Each tap cell further includes a first tap active and a second tap active. The first tap active of a first tap cell extends to the first tap active of a second tap cell which further extends to a well boundary of either the first tap cell or the second tap cell. The first tap active of the first tap cell and the first tap active of the second tap cell are adjacent to each other in the tap column.

12 Claims, 4 Drawing Sheets

| | 90nm | 65nm | 45nm | 28nm | 28nm PROPOSED SOLUTION | UNITS |
|---|---|---|---|---|---|---|
| TAP WIDTH | 2 | 2.14 | 3 | 7 | 3 | GRIDS |
| TAP TO TAP DISTANCE | 36 | 30 | 19 | 19 | 19 | u |
| % AREA OVERHEAD | 2.69% | 2.52% | 4.76% | 8.71% | 3.73% | |

ALTERNATING TAP-CELL STRATEGY IN A STANDARD CELL LOGIC BLOCK FOR AREA REDUCTION

This application claims the benefit of Provisional Application No. 61/746,692, filed Dec. 28, 2012.

TECHNICAL FIELD

Embodiments of the disclosure relate to arrangement of tap cells in an integrated circuit.

BACKGROUND

Integrated circuits (ICs) are built from standard cell circuits such as a NAND gate, NOR gate or an inverter on a semiconductor. Each standard cell circuit is made up of a number of transistors. In order to increase the number of transistors per die, the tools to manufacture integrated circuits employ smaller line widths and scaled down features. Tap cells are made with every standard cell to make connections to the substrate and well. While manufacturing the ICs, the tap cells are typically patterned using lower-resolution litho tools. In case of 28 nm technology node, the tap cells are patterned using 248 nm litho tools. The tap cells are generally pre-placed at a fixed pitch in a logic design block before the other standard cells get placed. The advanced 193 nm litho tool, which is of a higher cost, is used mainly for the critical mask layers and not to pattern the tap cells. In light of the continuing developments in the design and manufacture of integrated circuits, the cell dimensions are shrinking. The tap cells consume the area of the standard cell that may otherwise be available for other cell circuitry and for wires in the cell. The issue apparent is that the tap cells do not scale aggressively with technology nodes when 248 nm litho tools are used. Hence there exists a need to optimize number of transistors per die (area savings) and the cost of producing the ICs.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides arrangement of tap cells and tap actives on an integrated circuit. The integrated circuit includes a plurality of N wells disposed on a P substrate. A plurality of tap columns is located across the plurality of N wells and a plurality of standard cells is located between the tap columns. A plurality of tap cells is disposed consecutively in the plurality of tap columns. Each tap cell further comprises a first tap active and a second tap active. The first tap active of a first tap cell extends to the first tap active of a second tap cell which further extends to a well boundary of either the first tap cell or the second tap cell. The first tap active of the first tap cell and the first tap active of the second tap cell are adjacent to each other in the tap column.

Another example embodiment provides a method of manufacturing an integrated circuit. The method includes disposing a plurality of N wells on a P substrate and forming a plurality of tap columns across the plurality of N wells. A plurality of standard cells is placed between the tap columns. A plurality of tap cells is disposed consecutively in the plurality of tap columns. The method further provides forming a first tap active and a second tap active in each tap cell of the plurality of tap cells and extending the first tap active of a first tap cell to the first tap active of a second tap cell which further extends to a well boundary of either the first tap cell or the second tap cell. The first tap active of the first tap cell and the first tap active of the second tap cell are adjacent to each other in the tap column.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
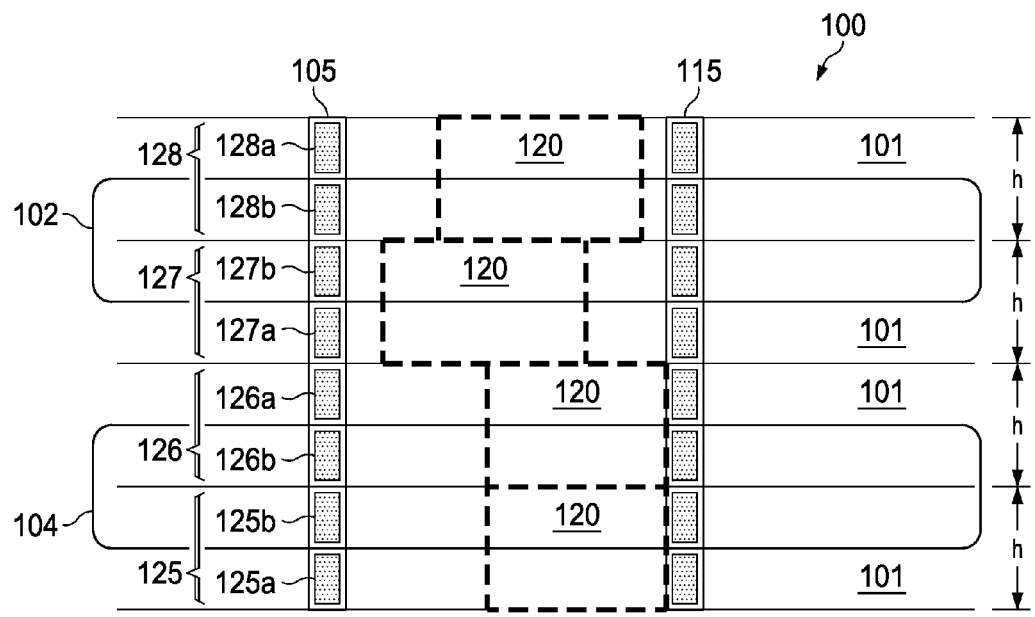
FIG. 1 illustrates a schematic of tap columns in an integrated circuit.

FIG. 1 illustrates a schematic of tap columns 105 and 115 in an integrated circuit 100. Integrated circuit (IC) includes a plurality of standard cells 120. A standard cell 120 is one of the following, but not limited to, a logic block, a gate, such as a NAND gate and an inverter. Each standard cell 120 has a fixed cell height 'h'. The integrated circuit 100 includes a P substrate 101 and a plurality of N-wells for example N-well 102 and 104. The integrated circuit 100 also includes a plurality of tap cells 125, 126, 127, 128 that are placed in the tap column 105 in order to save the area of the integrated circuit 100. Similarly, tap column 115 includes a plurality of tap cells. The tap cells 125-128 are fabricated according to a set of design rules associated with the integrated circuit 100. Each standard cell 120 is made up of a number of transistors. In order to increase the number of transistors per die, the tools to manufacture integrated circuits 100 employ smaller line widths and scaled down features.

In the integrated circuit 100, undesired bipolar transistors are inherently formed during the manufacturing process. These undesired bipolar transistors may impact the robustness of the integrated circuit 100. Latch-up is one such example which impacts the robustness of the standard cell 100. Latch-up occurs when the undesired bipolar transistors in combination with desired transistors create a positive feedback circuit to increase the circuit current such that the current capacity of the integrated circuit 100 is exceeded. Latch-up is prevented by placing tap cells 125-128 at regular intervals. Each tap cell 125-128 has two electrically conductive leads or tap actives, a first tap active that is formed on P substrate for example tap actives 125*a*, 126*a*, 127*a* and 128*a* and a second tap active that is formed on N-well for example tap actives 125*b*, 126*b*, 127*b* and 128*b*.

In one embodiment, a tap cell includes a plurality of first tap actives and a plurality of second tap actives. In alternate embodiment, the first tap active is formed on N-well and the second tap active is formed on P substrate. It is noted that in FIG. 1, the second tap active 125*b* and the second tap active 126*b* share a common N-well. Similarly, the first tap active 126*a* and a first tap active 127*a* are located on the P substrate. When placed in a substrate region, the first tap actives 125*a*-

128a couple the substrate region to a ground. When placed in a well region, the second tap actives 125b-128b couple the well region to a power source. The tap cells 125-128 by virtue of the electrically conductive leads i.e. tap actives reduces the substrate resistance, thus causing the positive feedback to be removed.

Figure 2:
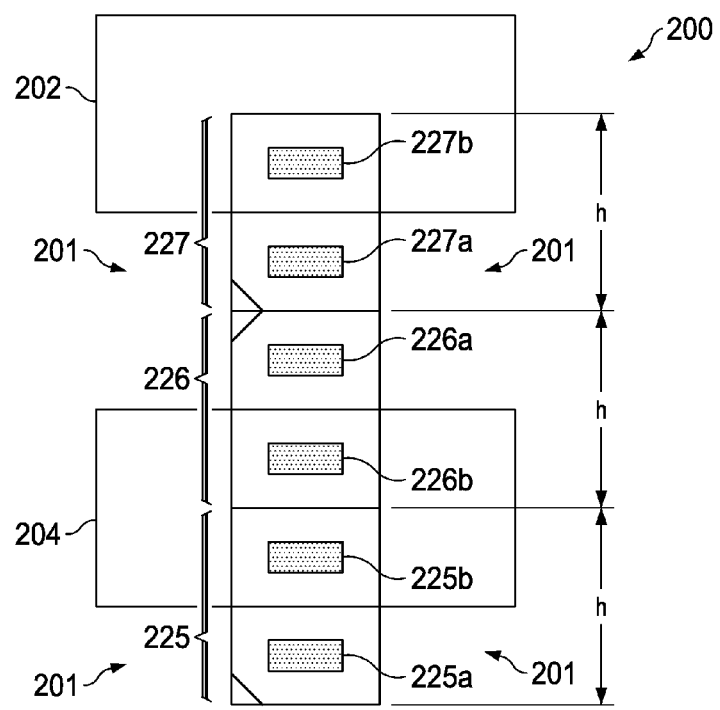
FIG. 2 illustrates a schematic of tap cells in an integrated circuit.

FIG. 2 illustrates a schematic of tap cells in an integrated circuit 200, according to an embodiment. The tap cells in FIG. 2 are similar in connections and functionality to the tap cells 125-128 shown in FIG. 1. The integrated circuit 200 includes a P substrate 201 and a plurality of N-wells, for example, N-well 202 and 204. The integrated circuit 200 also includes a plurality of tap cells 225, 226 and 227 arranged in series. Each tap cell 225-227 includes a first tap active that is formed on P substrate for example tap actives 225a, 226a, 227a and a second tap active that is formed on N-well, for example, tap actives 225b, 226b, 227b. In one embodiment, a tap cell includes a plurality of first tap actives and a plurality of second tap actives. In alternate embodiment, the first tap active is formed on N-well and the second tap active is formed on P substrate. The tap actives are placed such that they are contained within the boundaries of the tap cells 225-227. The tap cells 225-227 are patterned on the integrated circuit 200 using 28 nm technology node, which uses 248 nm litho tools. The area occupied by the tap cells 225-227 effectively increase due the reduction in the distance between the tap cells 225-227 and also because of the increase in the width of the tap cells 225-227. Therefore, the tap cells 225-227 consume the area of the integrated circuit 200 that may otherwise be available for other cell circuitry and wires in the cell.

Figures 3, 5:
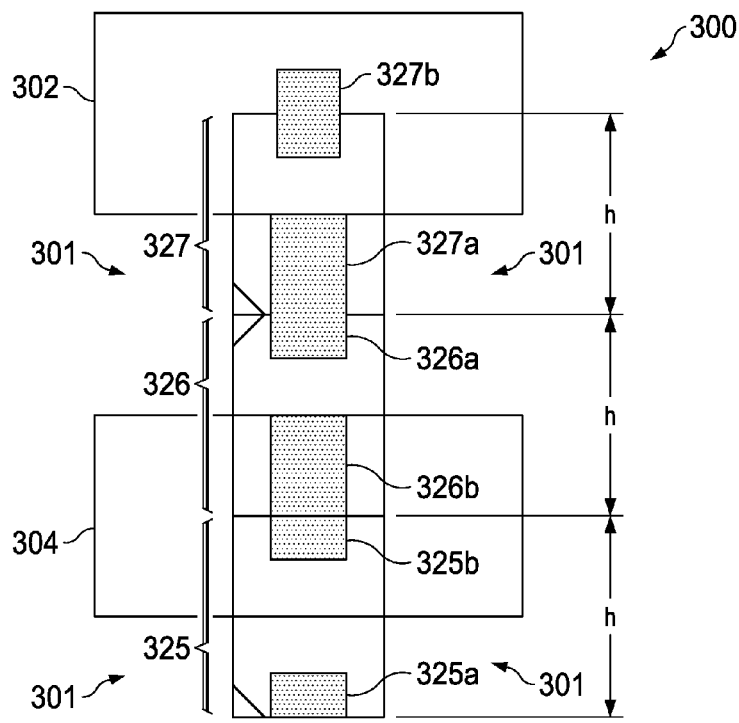
FIG. 3 illustrates a schematic of tap cells in an integrated circuit, according to an embodiment.
FIG. 5 is a table comparing the area overhead of the tap cells through various technology nodes.

FIG. 3 illustrates a schematic of tap cells in an integrated circuit 300, according to an embodiment. The integrated circuit 300 includes a plurality of N-well 302, 304 and a P substrate 301. A plurality of tap cells 325, 325, 327 is placed across the integrated circuit 300. Each tap cell is of height 'h'. Each tap cell 325-327 includes a first tap active that is formed on P substrate, for example, tap actives 325a, 326a, 327a and a second tap active that is formed on N-well for example tap actives 325b, 326b, 327b. In one embodiment, a tap cell includes a plurality of first tap actives and a plurality of second tap actives. In alternate embodiment, the first tap active is formed on N-well and the second tap active is formed on P substrate. The second tap active 325b of the tap cell 325 extends to the second tap active 326b of tap cell 326 which further extends to the well boundary of N-well 304 that is contained in the tap cell 326. Similarly, the first tap active 326a of the tap cell 326 extends to the first tap active 327a of the tap cell 327 which further extends to the well boundary of N-well 302 that is contained in tap cell 327. To reduce complexity in the manufacturing process this arrangement is repeated throughout the tap column. The process of extending tap actives is performed to meet a minimum area design rule associated with the integrated circuit. According to the minimum area design rule, the size of any geometry drawn in a tap layer should be such that its area is always greater than or equal to the technology specified value. This is essential for manufacturing a device. In an alternative embodiment, the second tap active 326b of the tap cell 326 extends to the second tap active 325b of the tap cell 325 which further extends to the well boundary of N-well that is contained in the tap cell 325. The first tap active 327a of the tap cell 327 extends to the first tap active 326a of the tap cell 326 which further extends to the well boundary of N-well 304 that is contained in tap cell 326. This extension of tap actives enables a reduction in the width of the tap cells 325-327 and also ensures that the minimum area design rule is met.

Figure 4:
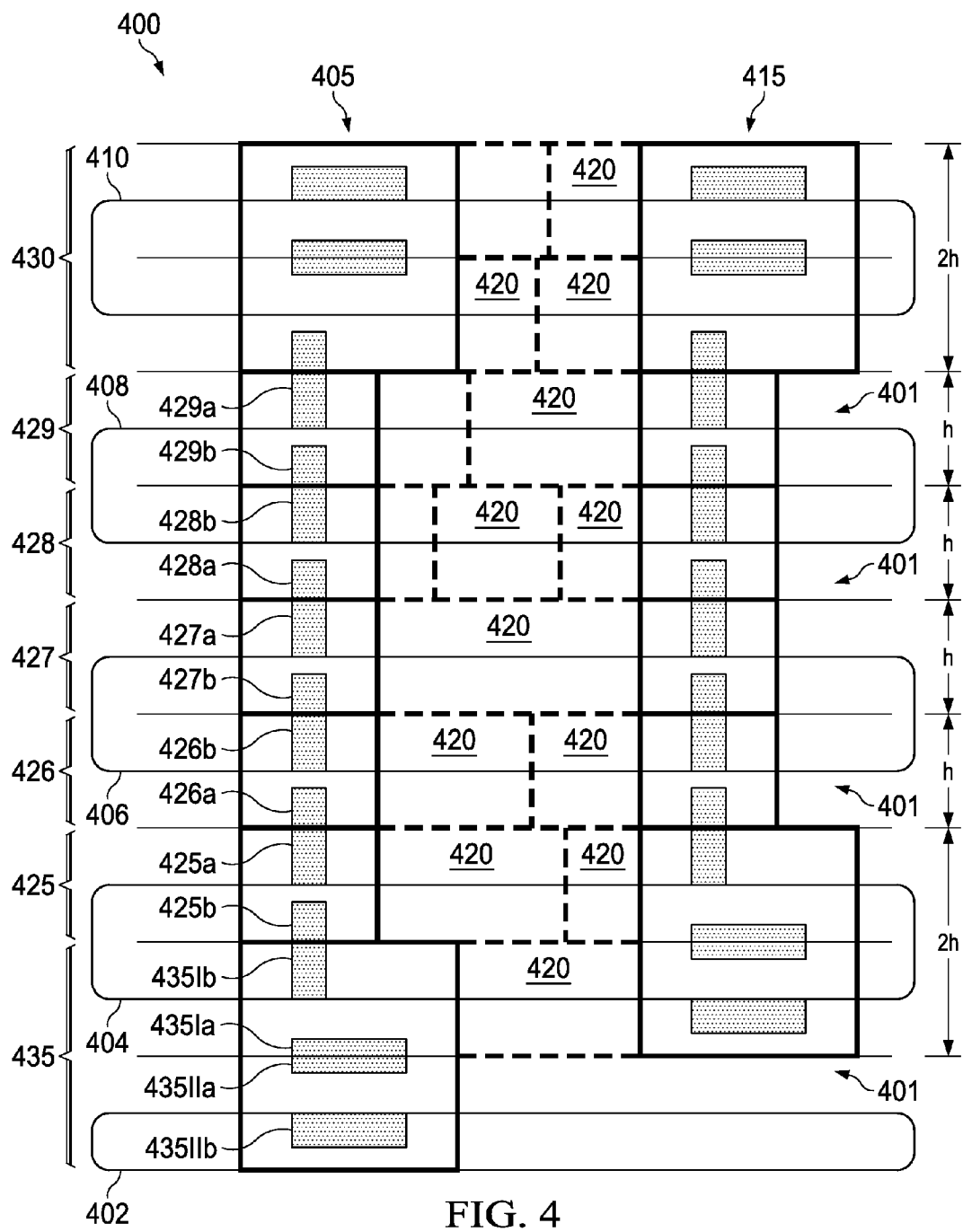
FIG. 4 illustrates a schematic of tap columns in an integrated circuit, according to an embodiment.

FIG. 4 illustrates a schematic of a plurality of tap columns 405, 415 in an integrated circuit 400, according to an embodiment. The integrated circuit 400 includes a plurality of N-well 402, 404, 406, 408 and 410 and a P substrate 401. The integrated circuit 400 includes a layout of standard cells 420 in between the tap columns 405 and 415. Each tap column 405 and 415 includes a plurality tap cells, for example tap column 405 includes tap cells 425, 426, 427, 428, and 429. Each tap cell is of height 'h'. Each tap cell 425-429 includes a first tap active that is formed on P substrate for example tap actives 425a, 426a, 427a, 428a, and 429a and a second tap active that is formed on N-well for example tap actives 425b, 426b, 427b, 428b, and 429b. In one embodiment, a tap cell includes a plurality of first tap actives and a plurality of second tap actives. In alternate embodiment, the first tap active is formed on N-well and the second tap active is formed on P substrate. The second tap active 429b of the tap cell 429 extends to the second tap active 428b of tap cell 428 which further extends to the well boundary of N-well 408 that is contained in the tap cell 428. Similarly, the first tap active 428a of the tap cell 428 extends to the first tap active 427a of the tap cell 427 which further extends to the well boundary of N-well 406 that is contained in tap cell 427. The process of extending tap actives is performed to meet the minimum area design rule associated with the integrated circuit. According to the minimum area design rule, the size of any geometry drawn in tap column should be such that its area is always greater than or equal to the technology specified value. This is essential for manufacturing a device.

Each tap column 405 and 415 also includes two end tap cells that are placed at a top end and a bottom end of each of the tap columns 405 and 415. The tap column 405 includes an end tap cell 430 at the top end of the tap column 405 and end tap cell 435 at the bottom of the tap column 405. Each end tap cell 430 and 435 is of height 2h. In another embodiment, the height of the end tap cells may vary based on the design requirement. For the sake of simplicity, the placement of tap actives inside the end tap cell using end tap cell 435 is explained. It is understood that the same design rule follows in other end tap cells of tap columns 405 and 415. Since, the end tap cell 435 is of height '2 h', it includes two sub-tap cells, 435I and 435II. In an alternative embodiment, the end tap cell contains plurality of sub-tap cells. As illustrated in FIG. 4, a second end tap active 425b of the adjacent tap cell 425 extends to a second tap active 435Ib of the sub-tap cell 435I of the end tap cell 435. A first tap active 435Ia of the sub-tap cell 435I extends to a first tap active 435IIa of the sub-tap cell 435II which further extends along the width of the end tap cell. A second tap active 435IIb of the sub-tap cell 435II is referred as end tap active in this arrangement. The end tap active 435IIb is within the end tap cell boundary and extends along the width of the end tap cell. It is understood that an end tap active can be a first tap active of a sub-tap cell for example in end tap cell 430, the end tap active is a first tap active since it is formed on a P substrate. The width of the end tap cells 430 and 435 is wider compared to other tap cells 425,426,427, 428,429 so that logic blocks such as analog blocks or digital blocks placed adjacent to the tap column 405 can be accommodated and also to meet the minimum area design rule. For this reason, the width of the tap actives 435Ia, 435IIa and the end tap active 435IIb is more as compared to the tap actives in other tap cells in the tap column 405. The width of the tap columns 405 and 415 is reduced over the entire length of the column, except for the end tap cells. The tap columns 405 and 415 typically comprises of a large number of consecutive cells in between the two end tap cells; therefore the area overhead caused by the end tap cells is insignificant. Thus, one of the advantages of the proposed solution is the area savings at the chip level. Therefore, there is optimization in the number of transistors per die (area savings) and cost of producing the IC, by using the proposed tap cell strategy.

FIG. 5 is a table comparing the area overhead of the tap cells through various technology nodes. From the table, it is seen in column 505 and 510, that for technology node 28 nm, a tap width of 7 poly pitches is used whereas for the same technology node (28 nm) the tap width is reduced to 3 poly pitches using the proposed solution. The percentage area overhead is reduced to 3.7% from 8.71% using the proposed solution. The main advantage of the proposed solution is the area savings at the chip level. In order to achieve similar area savings, the tap cell fabrication needs to be done with latest and costly lithography tools, such as the 193 nm litho tool. The advanced 193 nm litho tool is used mainly for the critical mask layers and not to pattern the tap cells. Although, the 193 nm litho tool can be used pattern the tap cells and achieve the similar results, it comes at a much higher cost as compared to the proposed solution. In other words the proposed solution enables area savings even when cheaper lithography tools for example 248 nm litho tool is used, thereby saving cost. Area savings of about 4% at SoC level directly translates to 4% cost benefit on products.

Figure 6:
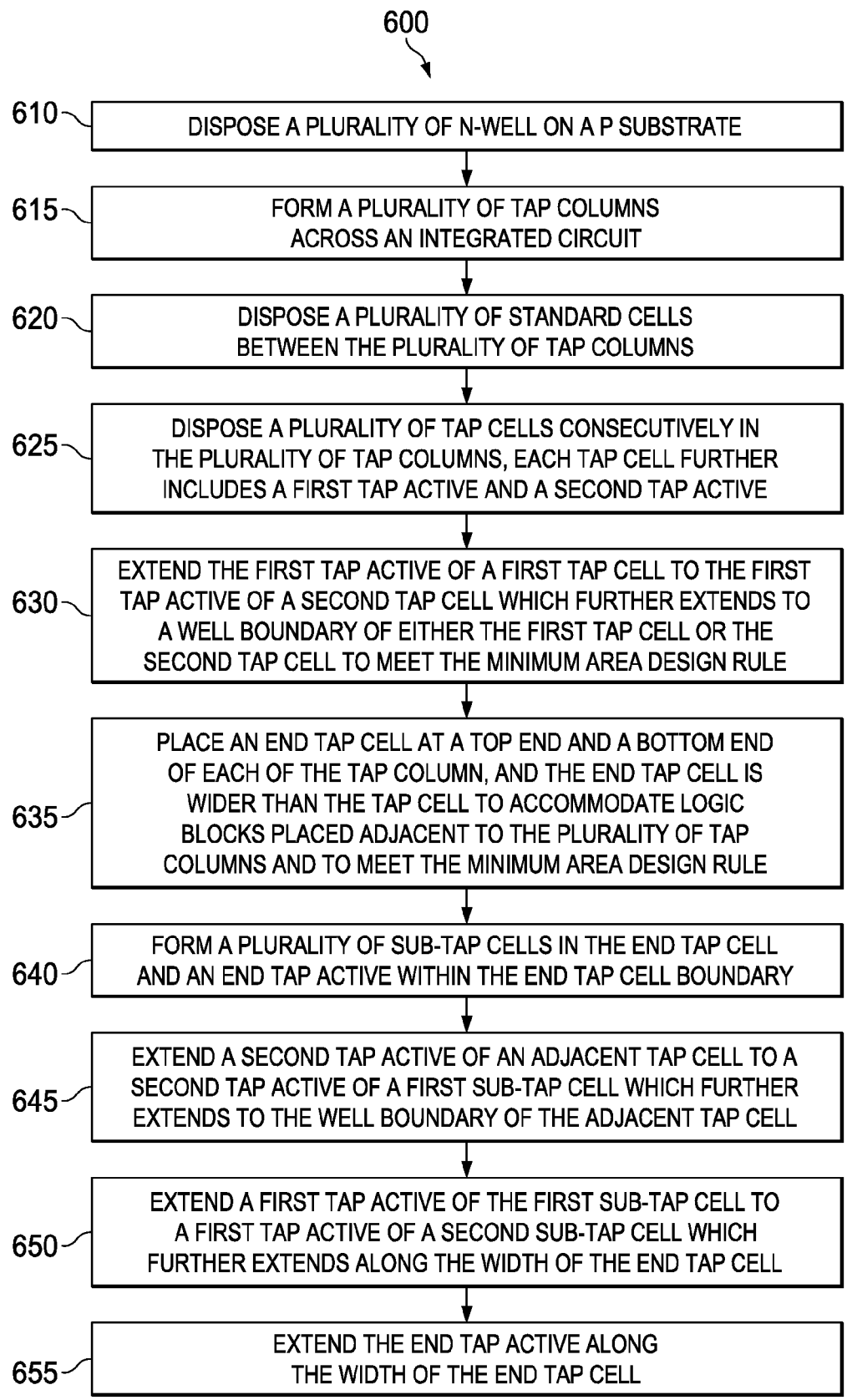
FIG. 6 is a flowchart illustrating a method of manufacturing an integrated circuit, according to an embodiment.

FIG. 6 is a flowchart 600 illustrating a method used to manufacture an integrated circuit 400. At step 610, a plurality of N-wells is disposed on a P substrate. A plurality of tap columns 405 and 415 are formed across an integrated circuit, at step 615. A plurality of standard cells is disposed between the plurality of tap columns, at step 620. Each tap column 405 and 415 includes a plurality of consecutive tap cells, and a first tap active and a second tap active is formed in each tap cell, at step 625. At step 630, the first tap active of a first tap cell extends to the first tap active of a second tap cell which further extends to a well boundary of either the first tap cell or the second tap cell to meet a minimum area design rule. The first tap cell and the second tap cell are adjacent in the tap column. The first tap active of the first tap cell and the first tap active of the second tap cell are placed consecutive in the tap column. Every tap column (405 and 415) ends with end tap cells, for example tap column 405 includes an end tap cell 430 at the top end of the tap column 405 and end tap cell 435 at the bottom of the tap column 405 and the end tap cell is wider than the tap cell to accommodate logic blocks placed adjacent to the plurality of tap columns and to meet the minimum area design rule (step 635). At step 640, a plurality of sub-tap cells in the end tap cell and an end tap active are formed within the end tap cell boundary. At step 645, a second tap active of an adjacent tap cell extends to a second tap active of a first sub-tap cell which further extends to the well boundary of the adjacent tap cell. At step 650, a first tap active of the first sub-tap cell extends to a first tap active of a second sub-tap cell which further extends along the width of the end tap cell. Finally at step 655, the end tap active is extended along the width of the end tap cell. The method results in area savings at the chip level which translates to cost benefits on products.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An integrated circuit comprising:
   a plurality of N wells on a P substrate;
   a plurality of tap columns located across the plurality of N wells on the P substrate;
   a plurality of standard cells between the plurality of tap columns;
   a plurality of tap cells disposed consecutively in the plurality of tap columns; each tap cell comprising a first tap active and a second tap active, wherein the first tap active of a first tap cell extends to the first tap active of a second tap cell which further extends to a well boundary of either the first tap cell or the second tap cell, and wherein, the first tap active of the first tap cell and the first tap active of the second tap cell are adjacent to each other in the tap column; and
   two end tap cells, one located at a top end of the tap column and the other at a bottom end of the tap column, wherein the end tap cells are wider than the tap cells to accommodate logic blocks disposed adjacent to the plurality of tap columns and to meet the minimum area design rule associated with the integrated circuit.

2. The integrated circuit of claim 1, wherein in adjacent tap cells, the first tap active of the first tap cell extends to the first tap active of the second tap cell which further extends to a well boundary to meet a minimum area design rule associated with the integrated circuit.

3. The integrated circuit of claim 1, wherein the first tap active is located on the P substrate and the second tap active is located on the N-well.

4. The integrated circuit of claim 1, wherein the first tap active is located on the N-well and the second tap active is located on the P substrate.

5. The integrated circuit of claim 1, wherein the end tap cell further comprises:
   a plurality of sub-tap cells in the end tap cell;
   a second tap active of an adjacent tap cell extending to the second tap active of a first sub-tap cell and further extending to the well boundary of the adjacent tap cell;
   the first tap active of the first sub-tap cell extending to the first tap active of a second sub-tap cell and further extending along the width of the end tap cell; and
   an end tap active located within the end tap cell boundary and extending along the width of the end tap cell, wherein the end tap active is a last tap active in the tap column.

6. A method of manufacturing an integrated circuit, comprising:
   disposing a plurality of N wells on a P substrate;
   forming a plurality of tap columns across the plurality of N wells on the P substrate;
   disposing a plurality of standard cells between the plurality of tap columns;
   disposing a plurality of tap cells consecutively in the plurality of tap columns;
   forming a first tap active and a second tap active in each tap cell of the plurality of tap cells; and
   extending the first tap active of a first tap cell to the first tap active of a second tap cell which further extends to a well boundary of either the first tap cell or the second tap cell and, wherein the first tap active of the first tap cell and the first tap active of the second tap cell are adjacent to each other in the tap column; wherein forming a plurality of tap columns comprises:
   disposing a plurality of the first tap cell and the second tap cell consecutively in each of the tap column;

disposing the first tap active of the first tap cell and the first tap active of the second tap cell consecutively across the tap column; and forming an end tap cell at a top end and a bottom end of each of the tap column, wherein the end tap cell is wider than the tap cell to accommodate logic blocks placed adjacent to the plurality of tap columns and to meet the minimum area design rule associated with the integrated circuit.

7. The method of claim 6, wherein extending the first tap active of a first tap cell to the first tap active of a second tap cell which further extends to a well boundary of either the first tap cell or the second tap cell in adjacent tap cells to meet a minimum area design rule associated with the integrated circuit.

8. The method of claim 6 further comprising forming the first tap active on the P substrate and forming the second tap active on the N-well.

9. The method of claim 6 further comprising forming the first tap active on the N-well and forming the second tap active on the P substrate.

10. The method of claim 6, wherein each end tap cell further comprises plurality of tap actives and an end tap active.

11. The method of claim 6, wherein forming the end tap cell comprises:

forming a plurality of sub-tap cells in the end tap cell;

extending the second tap active of an adjacent tap cell to the second tap active of a first sub-tap cell and further extending it to the well boundary of the adjacent tap cell;

extending the first tap active of the first sub-tap cell to the first tap active of a second sub-tap cell and further extending along the width of the end tap cell;

forming the end tap active within the end tap cell boundary, wherein the end tap active is a last tap active in the tap column; and extending the end tap active along the width of the end tap cell.

12. An integrated circuit comprising:

a plurality of N wells on a P substrate;

a plurality of tap columns located across the plurality of N wells on the P substrate;

a plurality of standard cells between the plurality of tap columns;

a plurality of tap cells disposed consecutively in the plurality of tap columns; each tap cell comprising a first tap active and a second tap active, wherein the first tap active of a first tap cell extends to the first tap active of a second tap cell which further extends to a well boundary of either the first tap cell or the second tap cell, and wherein, the first tap active of the first tap cell and the first tap active of the second tap cell are adjacent to each other in the tap column; and at least two end tap cells, one located at a top end of the tap column and the other at a bottom end of the tap column, wherein the end tap cells are wider than the tap cells.

* * * * *